Oct. 29, 1957 A. R. MOORE 2,811,653
SEMICONDUCTOR DEVICES
Filed May 22, 1953
Fig. 1
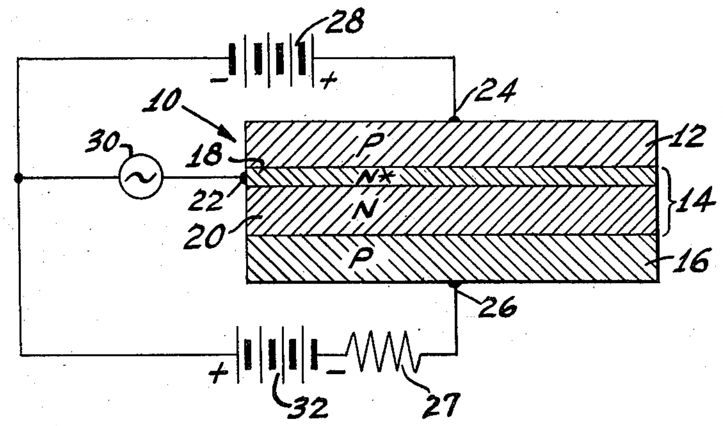
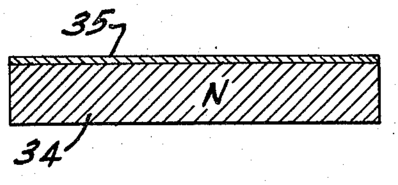
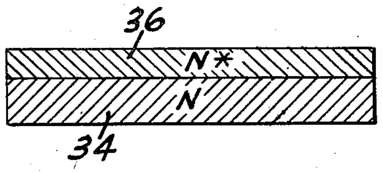
Fig. 2 Fig. 3
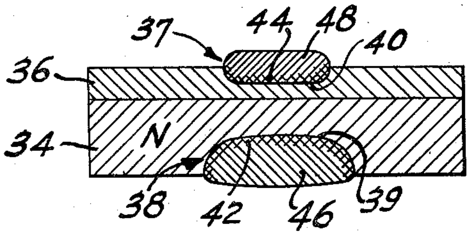
Fig. 4
INVENTOR.
Arnold R. Moore
BY J. L. Whittaker
ATTORNEY United States Patent Office 2,811,653

Patented Oct. 29, 1957

2,811,653

SEMICONDUCTOR DEVICES

Arnold R. Moore, Princeton, N. J., assignor to Radio Corporation of America, a corporation of Delaware Application May 22, 1953, Serial No. 356,658

7 Claims. (Cl. 307—88.5)

This invention relates to semiconductor devices and particularly to P–N junction-type semiconductor devices.

A typical junction type semiconductor device comprises a body of semiconductor material having alternating zones of different conductivity types separated by P–N junctions formed therein. The P–N junctions comprise rectifying barriers which have high resistance to electrical current flow in one direction and low resistance to such flow in the reverse direction.

One type of semiconductor device to which the principles of the invention apply is known as a transistor and may include three separate regions of semiconductor material arranged either in P–N–P or N–P–N order. In such devices, one of the semiconductor regions is operated as an emitter electrode and injects minority charge carriers into a second or base region, said carriers being collected by the third region which is operated as a collector electrode. A base electrode is generally connected in ohmic contact with the second region and serves to control the emitter-to-collector current flow.

A resistive parameter called base lead resistance is present in circuit between the base region and the base electrode of a transistor. This resistive parameter materially limits the high frequency performance of the device.

Another parameter is emitter input capacitance which is primarily due to the mode of transmission of the minority carriers through the base region by a process of diffusion. Thus, in effect, this capacitance is a diffusion capacitance and is proportional to the emitter current and to the square of the thickness of the base region between the emitter and collector electrodes. In the transistor, the base lead resistance in series with the emitter input capacitance forms a voltage divider which reduces the effective input signal at high frequencies. This action adversely affects the operation of a transistor at high frequencies.

The solution to the foregoing problem lies in reducing the base lead resistance and the emitter input capacitance to low values. One method of reducing the capacitance factor comprises applying a force on the charge carriers in the base region, in the form of an electric or magnetic field, to control the flow of minority charge carriers between the emitter and collector electrodes.

One method of reducing the base lead resistance comprises employing higher conductivity material for the base region. However, if such a course is followed, collector P–N junction breakdown becomes a problem. This problem arises because the higher conductivity material of the base region reduces the width of the space charge region at the collector P–N junction across which the applied collector voltage appears. A reduced collector junction space charge region lowers the collector breakdown voltage.

Accordingly, an important object of this invention is to provide a semiconductor device of new and improved form.

Another object of the invention is to provide an improved semiconductor device suitable for operation at high frequencies.

A further object of the invention is to provide an improved semiconductor device having reduced base lead resistance, reduced emitter input capacitance and comparatively high collector breakdown voltage.

In general, the purposes and objects of this invention are accomplished by the provision, in an N–P–N or P–N–P transistor, of a base region comprising two layers of material of the same type of conductivity but of different magnitudes of conductivity. The layer of higher conductivity is adjacent to the emitter electrode of the transistor and has the transistor base electrode connected thereto. The other base layer of lower conductivity is between the first mentioned base layer and the collector electrode.

The invention is described in greater detail by reference to the drawing wherein:

Fig. 1 is a sectional elevational view of a semiconductor device according to the invention;

Fig. 2 is a sectional elevation view of a device in one stage in its preparation according to the invention;

Fig. 3 is a sectional elevational view of the device of Fig. 2 in a later stage in its preparation; and, Fig. 4 is a sectional elevational view of a first modification of the invention.

Germanium and silicon are two materials often used at the present time in the preparation of semiconductor devices. A quantity of a semiconductor material, preferably germanium, of intrinsic purity, is treated with a very small amount of a so-called impurity substance to convert the intrinsic material to P-type or N-type conductivity. To produce P-type semiconductor material, the impurity material used is called "acceptor" impurity and may be one or more substances such as indium, aluminum, gallium, boron or zinc. To produce N-type semiconductor material, the impurity material used is called "donor" impurity and may be one or more substances such as antimony, bismuth, arsenic, sulfur, selenium, tellurium, or phosphorus.

P–N junction transistors of the type described above may be prepared from a semiconductor crystal of a selected type of conductivity by several methods including an alloying technique, a diffusion technique or by bombardment with charged particles.

In the preparation of P–N junctions by the alloying technique an impurity material is alloyed with a body of N-type or P-type conductivity semiconductor material such that a zone of conductivity type opposite to that of the body is formed therein. If the semiconductor material is of N-type conductivity, one or more of the foregoing acceptor impurity materials is employed. If the semiconductor material is of P-type conductivity, then one or more of the foregoing donor materials is employed.

In forming a P–N junction by a diffusion technique, a semiconductor crystal and a small quantity of impurity material are treated to cause atoms of the material to diffuse into the crystal and to enhance or reverse conductivity type thereby.

For the sake of convenience in the following discussion, the semiconductor material will be assumed to be N-type germanium and the acceptor P–N junction-forming impurity material will be assumed to be indium. Where required, the donor impurity material will be assumed to be antimony.

Similar elements are designated by similar reference characters throughout the drawing.

Referring to Figure 1, a semiconductor device 10 according to the invention comprises, for example, a first P-type germanium region 12 intended for operation as the emitter region of the device, a two-layered base region 14 of N-type germanium, and, finally, a region of P-type germanium 16. The last-named region is intended for operation as the collector region of the device 10. If desired, the conductivity types may be reversed. According to the invention, the base region 14 comprises two layers 18 and 20 of N-type germanium, with each layer having a different magnitude of conductivity. The layer 18 of higher conductivity, also designated N*, is positioned adjacent to the emitter region 12 and forms a P–N junction therewith. The layer of lower conductivity 20 is positioned adjacent to the collector region 16 and forms a P–N junction therewith. A base electrode 22 is connected in ohmic contact to the layer 18 which thus, effectively, comprises the base region of the device and other ohmic contact electrodes 24 and 26 are bonded to the emitter and collector regions 12 and 16 respectively. Resistor 27 serves as the output load resistance in the collector circuit.

The device 10 thus includes an effective base region 18 of low resistance which, in effect provides the device with comparatively low base lead resistance. The device further includes a base region 20 of high resistance adjacent to the collector region 16 and forming a portion of the collector P–N junction. Thus, the space charge region at the collector P–N junction has sufficient width to provide a comparatively high collector breakdown voltage. If the layer 20 has a sufficiently high resistivity, of the order of 20–50 ohm-centimeters, the space charge associated with the barrier will extend well into the layer 20 and provide an electric field within this region. The space charge, however, will not extend into the region 18. Thus, within the base layer 18, minority charge carriers will flow by diffusion; while within the layer 20, the charge carriers will flow under the influence of the electric field therein. With a collector voltage of just a few volts, this electric field will be strong enough so that the transit time in the low conductivity layer 20 will be negligible compared to the diffusion transit time in the high conductivity layer. Thus, since transit time is not materially increased, the additional base layer thickness due to the low conductivity layer will not contribute to the emitter input capacitance. Furthermore, if the conductivity of the layer 18 is sufficiently high (the conductivity of the emitter region 12 also being appropriately high to maintain emitter input efficiency), it may be made arbitrarily thin without the base lead resistance being increased. Thus, by reducing the length of the charge carrier diffusion path, the emitter input capacitance is reduced.

In operation of the device 10, the P-type region 12 is operated as the emitter and, accordingly, is biased in the forward direction with respect to the base region 18 by a connection to the positive terminal of a battery 28, the negative terminal of which is connected to the base electrode 22. A signal source 30 is connected in circuit either with the emitter region or, as shown, with the base region 18 to provide either input to the emitter or to the base respectively. The P-type region 16 is operated as the collector region and accordingly is biased in the reverse direction with respect to the base 18 by a connection to the negative terminal of a battery 32, the positive terminal of which is connected to the base electrode.

The device of the invention may be prepared, referring to Figure 2 according to one method, from a crystal 34 of N-type germanium of a low conductivity, e. g. 20–50 ohm-centimeters. A quantity of donor impurity material, e. g. antimony, is evaporated onto one surface of the crystal in the form of a thin film 35. Referring to Figure 3, the crystal is then heated to cause the impurity material to diffuse into the body of the crystal and to form a layer 36 of higher conductivity material of the order of a few tenths ohm-centimeter. The region 36 blends gradually with the remainder of the crystal 34 and, in general, a strongly rectifying barrier is not present between the two regions. The heating operation must be adequate to form the layer of sufficient thickness to receive, in the next stage of the process, a P–N junction. For a crystal 5 or 6 mils thick, and assuming an antimony layer 300 Angstroms thick, heating for a time of the order of several hours at a temperature in the range of 750–850° C. is satisfactory.

Next, a P–N junction is formed in each of the layers of N-type germanium 34 and 36. One suitable P–N junction forming method employs an alloying technique such as that described by C. W. Mueller in his U. S. patent application, Serial Number 294,741, filed June 20, 1952. According to Mueller's method, a pellet or disk of a suitable donor or acceptor impurity material, in this instance an acceptor material such as indium, is alloyed into each layer 34 and 36 to form P–N junctions 37 and 38 including rectifying barriers 39 and 40 and layers 42 and 44 of opposite-type conductivity material i. e. P-type material. Adjacent to each P-type layer 42 and 44 is a region 46 and 48 of material consisting of an alloy of indium and germanium. The P-type region 44 is intended for operation as the emitter of the device and the P-type region 42 is intended for operation as the collector of the device.

According to an alternative method of preparing the device, the two-layered N-type body 14 of Figure 1 and 34—36 of Figure 3 may be prepared by a crystal growing operation from a melt of germanium. A method and apparatus for growing such a crystal is described in a co-pending U. S. application of the present inventor, Serial Number 285,584, filed May 1, 1952, and now Patent 2,753,280. The apparatus described in this application includes a large carbon crucible rotatably mounted on a shaft within an electric furnace. The large carbon crucible is divided into three separate smaller crucibles interconnected by a system of channels and valves. The smaller crucibles contain melts of the material to be crystallized, each melt having a somewhat different composition as required. For example, one crucible may contain P-type material and the other crucibles may contain quantities of N-type material of different magnitudes of conductivity.

To prepare a portion of 20–50 ohm-centimeter N-type germanium, one crucible is provided with a melt of germanium having approximately one part of N-type impurity material, for example arsenic, in $10^9$ parts of germanium. To prepare N-type germanium having a resistivity of a few tenths ohm-centimeter, the melt contains approximately one part of arsenic in $10^7$ parts of germanium. In operation of the crystal growing apparatus, a seed crystal is lowered on the end of a shaft until it touches the surface of the melt in a selected one of the small crucibles. The seed crystal is then withdrawn so that a portion of the melt crystallizes upon it, thereby growing a zone of that type of material. Then the growing crystal is transferred to an adjacent crucible without breaking contact with the melt so that a zone of that type of material is grown. This process may be continued to grow more zones of the desired types of conductivity.

After the two-layered crystal 14 has been grown, the emitter and collector P–N junctions 37 and 38 may be prepared therein by alloying indium pellets into each layer according to the foregoing Mueller method.

A third method of preparing the device of the invention produces a device as shown in Figure 1 and is accomplished entirely by growth from the melt. According to this method, employing the present inventor's teaching in the above-identified application, crystal growth originates in a P-type melt. After the P-type layer 16 is formed, donor impurity is added to the melt to form the N-type layer 20. Next, further donor impurity is added to form the higher conductivity N-type layer 18. Finally, acceptor impurity is added to form the P-type layer 12. If desired, the two N-type regions 18 and 20 may be grown in the reverse order by suitably controlling the addition of the proper impurity material.

What is claimed is:

1. A semiconductor device comprising a body of crystalline semiconductor material consisting of a plurality of layers of semiconductor materials including in order a first layer of one type of conductivity material, a second layer of opposite conductivity type material, a third layer of material of the same type of conductivity as said second layer, said second layer having a higher conductivity than said third layer, and a fourth layer of material of the same type of conductivity as said first layer.

2. A semiconductor device comprising a body of crystalline semiconductor material having an emitter semiconductor region and a collector semiconductor region of the same conductivity type material, a base region of opposite conductivity-type material interposed between said two regions and separated therefrom by rectifying barriers, said base region including two layers of different magnitude of conductivity, the layer of lower conductivity being adjacent to said collector region and the layer of higher conductivity being adjacent to said emitter region.

3. A transistor comprising a body of crystalline semiconducting material selected from the class consisting of germanium and silicon and having a pair of opposed surfaces, said body having a conductivity type determining impurity distribution such that the impurity concentration gradually diminishes from one surface toward the opposite surface thereof, a rectifying electrode surface alloyed to said one surface and another rectifying electrode surface alloyed to said opposite surface.

4. A semiconductor device comprising a body of crystalline semiconductor material consisting of a plurality of layers of semiconductor materials selected from the class consisting of germanium and silicon including in order a first layer of one type of conductivity material, a second layer of opposite conductivity type material, a third layer of material of the same type of conductivity as said second layer, said second layer having a higher conductivity than said third layer, and a fourth layer of material of the same type of conductivity as said first layer.

5. A semiconductor device comprising a body of crystalline semiconductor material selected from the class consisting of germanium and silicon having an emitter semiconductor region and a collector semiconductor region of the same conductivity type material, a base region of opposite conductivity type material interposed between said two regions and separated therefrom by rectifying barriers, said base region including two layers of different magnitude of conductivity, the layer of lower conductivity being adjacent to said collector region and the layer of higher conductivity being adjacent to said emitter region.

6. A semiconductor device comprising a body of crystalline semiconductor material, an emitter electrode in rectifying contact with said body, a collector electrode in rectifying contact with said body, the material of said body having a non-uniform conductivity distribution such that the impurity concentration gradually diminishes from one surface toward the opposite surface thereof, with higher conductivity material adjacent to said emitter electrode and lower conductivity material adjacent to said collector electrode, means for making electrical connections to said emitter electrode and to said collector electrode, and means for making electrical connection to said higher conductivity material of said semiconductor material adjacent said emitter electrode.

7. A semiconductor device according to claim 6, wherein said crystalline semiconductor material comprises germanium.

References Cited in the file of this patent

UNITED STATES PATENTS

| | | |
|---|---|---|
| 2,293,248 | Fink et al. | Aug. 18, 1942 |
| 2,479,301 | Blackburn et al. | Aug. 16, 1949 |
| 2,554,237 | Blackburn | May 22, 1951 |
| 2,569,347 | Shockley | Sept. 25, 1951 |
| 2,603,692 | Scaff | July 15, 1952 |
| 2,603,693 | Kircher | July 15, 1952 |
| 2,623,102 | Shockley | Dec. 23, 1952 |
| 2,631,356 | Sparks | Mar. 17, 1953 |
| 2,730,470 | Shockley | Jan. 10, 1956 |
| 2,744,970 | Shockley | May 8, 1956 |